US011276981B2

United States Patent
Sugime

(10) Patent No.: US 11,276,981 B2
(45) Date of Patent: Mar. 15, 2022

(54) PSE DEVICE AND POWERED DEVICE OF OPTICAL POWER SUPPLY SYSTEM, AND OPTICAL POWER SUPPLY SYSTEM

(71) Applicant: KYOCERA Corporation, Kyoto (JP)

(72) Inventor: Tomonori Sugime, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/944,068

(22) Filed: Jul. 30, 2020

(65) Prior Publication Data
US 2020/0373724 A1 Nov. 26, 2020

Related U.S. Application Data

(62) Division of application No. 16/870,826, filed on May 8, 2020.

(30) Foreign Application Priority Data

May 24, 2019 (JP) .............................. JP2019-097548

(51) Int. Cl.
*H04B 10/80* (2013.01)
*H01S 3/067* (2006.01)
(Continued)

(52) U.S. Cl.
CPC ........ *H01S 3/06708* (2013.01); *G02B 6/4296* (2013.01); *H01S 5/3013* (2013.01); *H01S 5/3045* (2013.01); *H04B 10/807* (2013.01)

(58) Field of Classification Search
CPC .. H01S 5/3013; H01S 5/32341; H01S 5/3045; H04B 10/807
See application file for complete search history.

(56) References Cited

U.S. PATENT DOCUMENTS 6,242,764 B1 6/2001 Ohba et al.
2003/0026310 A1 2/2003 Valliath
(Continued)

FOREIGN PATENT DOCUMENTS

JP 2010135989 * 6/2010
JP 2010135989 A 6/2010

OTHER PUBLICATIONS

Yuan Qin, "Review of deep ultraviolet photodetector based on gallium oxide" 2019, Chin Phys B, vol. 28, No. 1, 018501. (Year: 2019 ).*

*Primary Examiner* — Michael Carter
(74) *Attorney, Agent, or Firm* — Hauptman Ham, LLP

(57) ABSTRACT

A power sourcing equipment (PSE) device of an optical power supply system includes a semiconductor laser that oscillates with electric power, thereby outputting feed light. The semiconductor laser includes a semiconductor region exhibiting a light-electricity conversion effect. A semiconductor material of the semiconductor region is a laser medium having a laser wavelength of 500 nm or less. A powered device of the optical power supply system includes a photoelectric conversion element that converts feed light into electric power. The photoelectric conversion element includes a semiconductor region exhibiting a light-electricity conversion effect. A semiconductor material of the semiconductor region is a laser medium having a laser wavelength of 500 nm or less.

10 Claims, 4 Drawing Sheets

(51) Int. Cl.
*G02B 6/42* (2006.01)
*H01S 5/30* (2006.01)

(56) References Cited

U.S. PATENT DOCUMENTS

| | | |
|---|---|---|
| 2010/0326496 A1 | 12/2010 | Bhattacharya et al. |
| 2012/0093185 A1* | 4/2012 | Shimizu .................. H01L 24/83 372/43.01 |
| 2015/0335231 A1* | 11/2015 | Van Der Mark .. A61B 5/02055 600/301 |
| 2017/0093501 A1 | 3/2017 | Meitl et al. |

* cited by examiner

PSE DEVICE AND POWERED DEVICE OF OPTICAL POWER SUPPLY SYSTEM, AND OPTICAL POWER SUPPLY SYSTEM

CROSS-REFERENCE TO RELATED APPLICATIONS

The present application is a divisional of U.S. patent application Ser. No. 16/870,826 filed on May 8, 2020, and is based upon and claims the benefit of priority from the prior Japanese Patent Application No. 2019-097548, filed on May 24, 2019, the entire contents of which are incorporated herein by reference.

BACKGROUND

Technical Field

The present disclosure relates to optical power supply.

Description of Related Art

Recently, there has been studied an optical power supply system that converts electric power into light called feed light, transmits the feed light, converts the feed light into electric energy, and uses the electric energy as electric power.

There is disclosed in JP 2010-135989 A an optical communication device that includes: an optical transmitter that transmits signal light modulated with an electric signal and feed light for supplying electric power; an optical fiber including a core that transmits the signal light, a first cladding that is formed around the core, has a refractive index lower than that of the core, and transmits the feed light, and a second cladding that is formed around the first cladding, and has a refractive index lower than that of the first cladding; and an optical receiver that operates with electric power obtained by converting the feed light transmitted through the first cladding of the optical fiber, and converts the signal light transmitted through the core of the optical fiber into the electric signal.

SUMMARY

In optical power supply, further improvement of optical power supply efficiency is required. For that, for example, improvement of photoelectric conversion efficiency at the power supplying side and the power receiving side is required.

According to a first aspect of the present disclosure, there is provided a power sourcing equipment (PSE) device of an optical power supply system, including a semiconductor laser that oscillates with electric power, thereby outputting feed light, and includes a semiconductor region exhibiting a light-electricity conversion effect, wherein a semiconductor material of the semiconductor region is a laser medium having a laser wavelength of 500 nm or less.

According to a second aspect of the present disclosure, there is provided an optical power supply system including:
  the above PSE device; and
  a powered device including a photoelectric conversion element that converts the feed light output by the PSE device into electric power.

According to a third aspect of the present disclosure, there is provided a powered device of an optical power supply system, including a photoelectric conversion element that converts feed light into electric power, and includes a semiconductor region exhibiting a light-electricity conversion effect, wherein a semiconductor material of the semiconductor region is a laser medium having a laser wavelength of 500 nm or less.

According to a fourth aspect of the present disclosure, there is provided an optical power supply system including:
  a power sourcing equipment (PSE) device including a semiconductor laser that oscillates with electric power, thereby outputting feed light; and
  the above powered device,
  wherein the feed light is input to the powered device.

BRIEF DESCRIPTION OF THE DRAWINGS

The accompanying drawings are not intended as a definition of the limits of the invention but illustrate embodiments of the invention, and together with the general description given above and the detailed description of the embodiments given below, serve to explain the principles of the invention, wherein.

DETAILED DESCRIPTION OF EMBODIMENTS

Hereinafter, one or more embodiments of the present disclosure will be described with reference to the drawings. However, the scope of the present invention is not limited to the disclosed embodiments or illustrated examples.

First Embodiment

Figure 1:
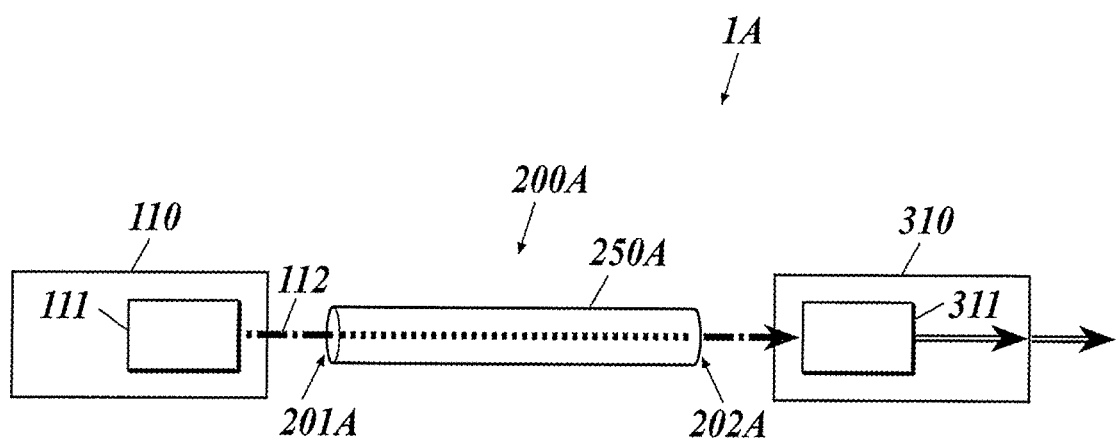
FIG. 1 is a block diagram of a power over fiber system according to a first embodiment of the present disclosure.

As shown in FIG. 1, a power over fiber (PoF) system 1A (optical power supply system) of this embodiment includes a power sourcing equipment (PSE) device 110, an optical fiber cable 200A and a powered device (PD) 310.

In the present disclosure, a PSE device converts electric power into optical energy and supplies (sources) the optical energy, and a powered device receives (draws) the supplied optical energy and converts the optical energy into electric power.

The PSE device 110 includes a semiconductor laser 111 for power supply.

The optical fiber cable 200A includes an optical fiber 250A that forms a transmission path of feed light.

The powered device 310 includes a photoelectric conversion element 311.

The PSE device 110 is connected to a power source, and electrically drives the semiconductor laser 111 and so forth.

The semiconductor laser 111 oscillates with the electric power from the power source, thereby outputting feed light 112.

The optical fiber cable 200A has one end 201A (first end) connectable to the PSE device 110 and the other end 202A (second end) connectable to the powered device 310 to transmit the feed light 112.

The feed light 112 from the PSE device 110 is input to the one end 201A of the optical fiber cable 200A, propagates through the optical fiber 250A, and is output from the other end 202A of the optical fiber cable 200A to the powered device 310.

The photoelectric conversion element 311 converts the feed light 112 transmitted through the optical fiber cable 200A into electric power. The electric power obtained by the conversion of the feed light 112 by the photoelectric conversion element 311 is driving power needed in the powered device 310. The powered device 310 is capable of outputting, for an external device(s), the electric power obtained by the conversion of the feed light 112 by the photoelectric conversion element 311.

Semiconductor materials of semiconductor regions of the semiconductor laser 111 and the photoelectric conversion element 311 are semiconductors having a laser wavelength being a short wavelength of 500 nm or less. The semiconductor regions exhibit light-electricity conversion effect.

Semiconductors having a laser wavelength being a short wavelength have a large band gap and a high photoelectric conversion efficiency, and hence improve photoelectric conversion efficiency at the power supplying side (PSE side) and the power receiving side (PD side) in optical power supply, and improve optical power supply efficiency.

Hence, as the semiconductor materials, laser media having a laser wavelength (base wave) of 200 nm to 500 nm may be used. Examples thereof include diamond, gallium oxide, aluminum nitride and gallium nitride.

Further, as the semiconductor materials, semiconductors having a band gap of 2.4 eV or greater are used.

For example, laser media having a band gap of 2.4 eV to 6.2 eV may be used. Examples thereof include diamond, gallium oxide, aluminum nitride and gallium nitride.

Laser light having a longer wavelength tends to have a higher transmission efficiency, whereas laser light having a shorter wavelength tends to have a higher photoelectric conversion efficiency. Hence, when laser light is transmitted for a long distance, laser media having a laser wavelength (base wave) of greater than 500 nm may be used, whereas when the photoelectric conversion efficiency is given priority, laser media having a laser wavelength (base wave) of less than 200 nm may be used.

Any of these semiconductor materials may be used in one of the semiconductor laser 111 and the photoelectric conversion element 311. This improves the photoelectric conversion efficiency at either the PSE side or the PD side, and improves the optical power supply efficiency.

Second Embodiment

Figure 2:
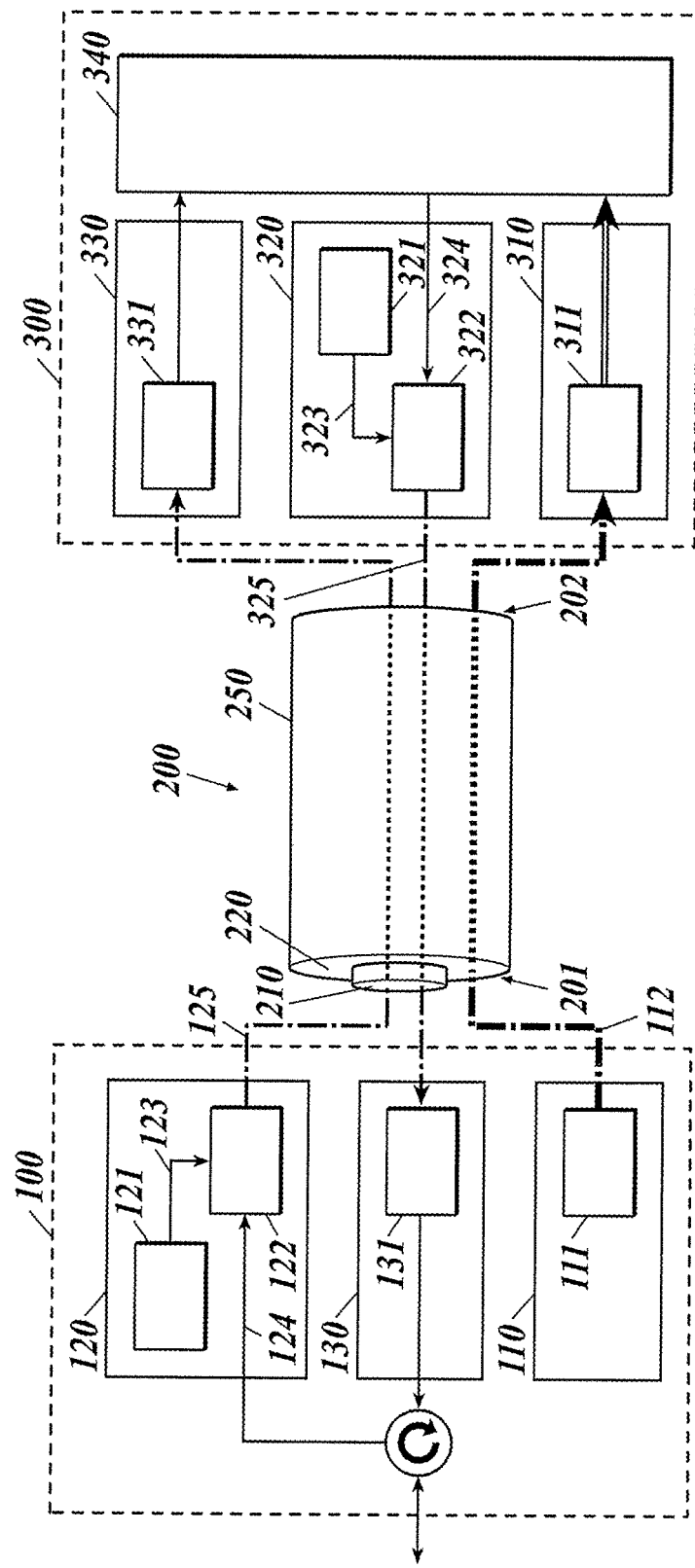
FIG. 2 is a block diagram of a power over fiber system according to a second embodiment of the present disclosure.

As shown in FIG. 2, a power over fiber (PoF) system 1 of this embodiment includes a power supply system through an optical fiber and an optical communication system therethrough, and includes: a first data communication device 100 including a power sourcing equipment (PSE) device 110; an optical fiber cable 200; and a second data communication device 300 including a powered device (PD) 310.

The PSE device 110 includes a semiconductor laser 111 for power supply. The first data communication device 100 includes, in addition to the PSE device 110, a transmitter 120 and a receiver 130 for data communication. The first data communication device 100 corresponds to a data terminal equipment (DTE) device, a repeater or the like. The transmitter 120 includes a semiconductor laser 121 for signals and a modulator 122. The receiver 130 includes a photodiode 131 for signals.

The optical fiber cable 200 includes an optical fiber 250 including: a core 210 that forms a transmission path of signal light; and a cladding 220 that is arranged so as to surround the core 210 and forms a transmission path of feed light.

The powered device 310 includes a photoelectric conversion element 311. The second data communication device 300 includes, in addition to the powered device 310, a transmitter 320 and a receiver 330 for data communication, and a data processing unit 340. The second data communication device 300 corresponds to a power end station or the like. The transmitter 320 includes a semiconductor laser 321 for signals and a modulator 322. The receiver 330 includes a photodiode 331 for signals. The data processing unit 340 processes received signals. The second data communication device 300 is a node in a communication network. The second data communication device 300 may be a node that communicates with another node.

The first data communication device 100 is connected to a power source, and electrically drives the semiconductor laser 111, the semiconductor laser 121, the modulator 122, the photodiode 131 and so forth. The first data communication device 100 is a node in a communication network. The first data communication device 100 may be a node that communicates with another node.

The semiconductor laser 111 oscillates with the electric power from the power source, thereby outputting feed light 112.

The photoelectric conversion element 311 converts the feed light 112 transmitted through the optical fiber cable 200 into electric power. The electric power obtained by the conversion of the feed light 112 by the photoelectric conversion element 311 is driving power needed in the second data communication device 300, for example, driving power for the transmitter 320, the receiver 330 and the data processing unit 340. The second data communication device 300 may be capable of outputting, for an external device(s), the electric power obtained by the conversion of the feed light 112 by the photoelectric conversion element 311.

The modulator 122 of the transmitter 120 modulates laser light 123 output by the semiconductor laser 121 to signal light 125 on the basis of transmission data 124, and outputs the signal light 125.

The photodiode 331 of the receiver 330 demodulates the signal light 125 transmitted through the optical fiber cable 200 to an electric signal, and outputs the electric signal to the data processing unit 340. The data processing unit 340 transmits data of the electric signal to a node, and also receives data from the node and outputs the data to the modulator 322 as transmission data 324.

The modulator 322 of the transmitter 320 modulates laser light 323 output by the semiconductor laser 321 to signal light 325 on the basis of the transmission data 324, and outputs the signal light 325.

The photodiode 131 of the receiver 130 demodulates the signal light 325 transmitted through the optical fiber cable 200 to an electric signal, and outputs the electric signal. Data of the electric signal is transmitted to a node, whereas data from the node is the transmission data 124.

The feed light 112 and the signal light 125 from the first data communication device 100 are input to one end 201 (first end) of the optical fiber cable 200, propagate through the cladding 220 and the core 210, respectively, and are output from the other end 202 (second end) of the optical fiber cable 200 to the second data communication device 300.

The signal light 325 from the second data communication device 300 is input to the other end 202 of the optical fiber cable 200, propagates through the core 210, and is output from the one end 201 of the optical fiber cable 200 to the first data communication device 100.

Figure 3:
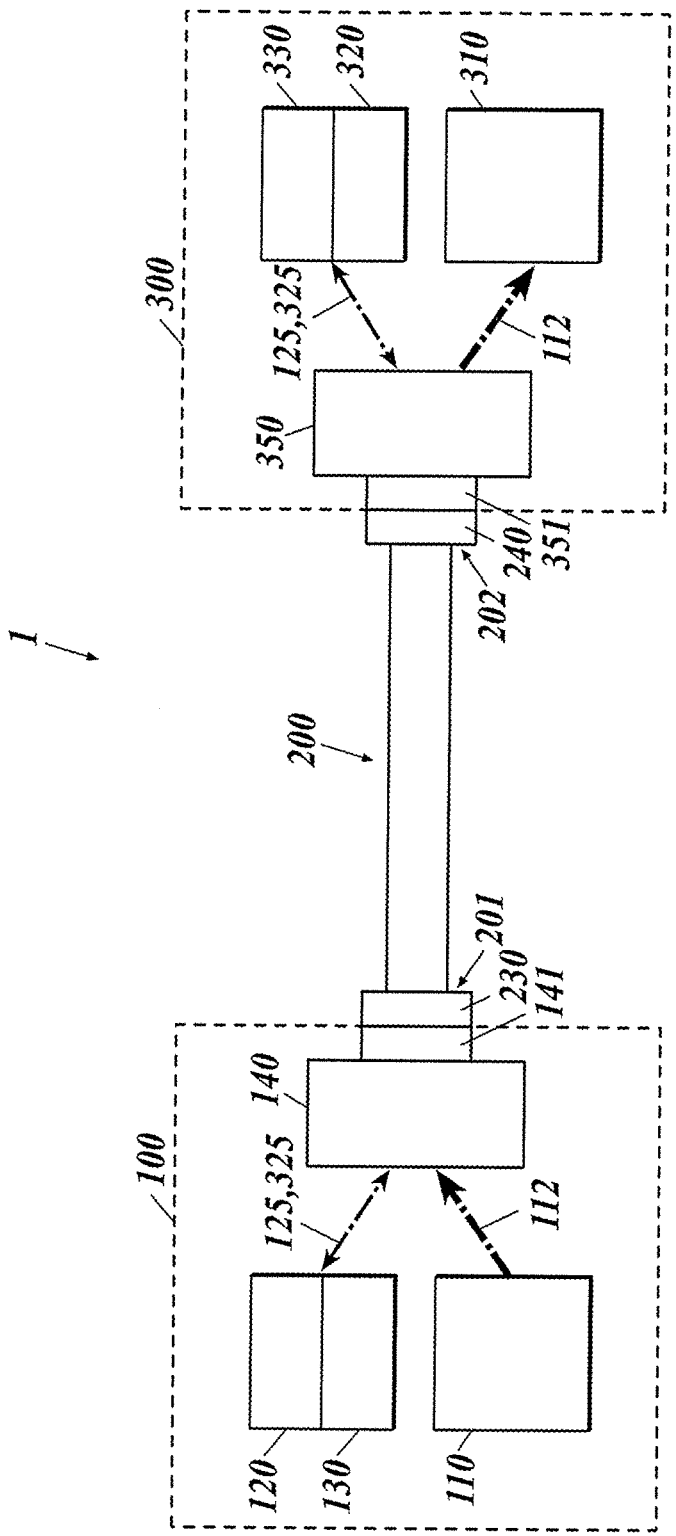
FIG. 3 is a block diagram of the power over fiber system according to the second embodiment of the present disclosure and shows optical connectors and so forth.

As shown in FIG. 3, the first data communication device 100 includes a light input/output part 140 and an optical connector 141 attached to the light input/output part 140, and the second data communication device 300 includes a light input/output part 350 and an optical connector 351 attached to the light input/output part 350. An optical connector 230 provided at the one end 201 of the optical fiber cable 200 is connected to the optical connector 141, and an optical connector 240 provided at the other end 202 of the optical fiber cable 200 is connected to the optical connector 351. The light input/output part 140 guides the feed light 112 to the cladding 220, guides the signal light 125 to the core 210, and guides the signal light 325 to the receiver 130. The light input/output part 350 guides the feed light 112 to the powered device 310, guides the signal light 125 to the receiver 330, and guides the signal light 325 to the core 210.

As described above, the optical fiber cable 200 has the one end 201 connectable to the first data communication device 100 and the other end 202 connectable to the second data communication device 300 to transmit the feed light 112. In this embodiment, the optical fiber cable 200 transmits the signal light 125/325 bidirectionally.

As the semiconductor materials of the semiconductor regions, which exhibit the light-electricity conversion effect, of the semiconductor laser 111 and the photoelectric conversion element 311, any of those described in the first embodiment can be used, thereby achieving a high optical power supply efficiency.

Although some embodiments of the present disclosure have been described above, these embodiments are made for purposes of illustration and example only. The present invention can be carried out in various other forms, and each component may be omitted, replaced or modified without departing from the scope of the present invention.

Figure 4:
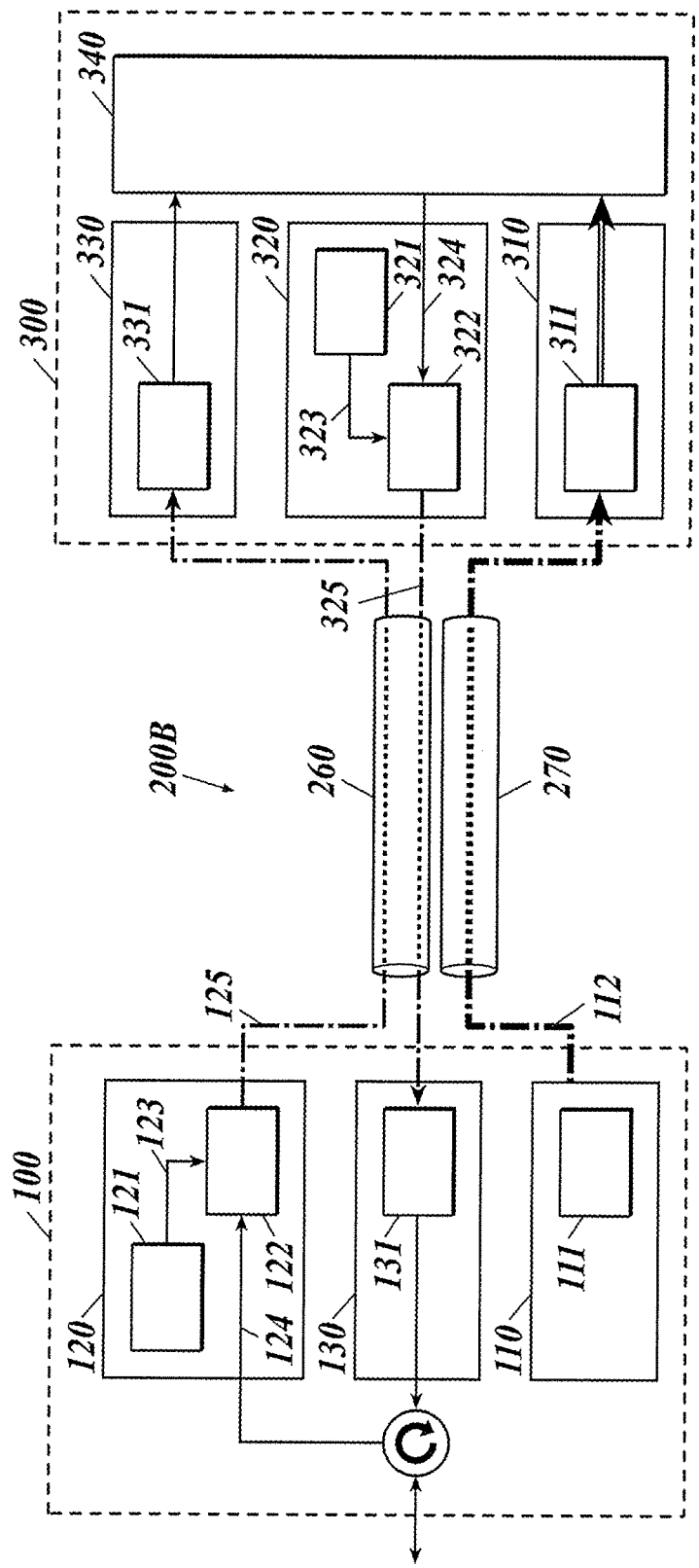
FIG. 4 is a block diagram of a power over fiber system according to another embodiment of the present disclosure.

For example, like an optical fiber cable 200B of a power over fiber system 1B shown in FIG. 4, an optical fiber 260 that transmits signal light and an optical fiber 270 that transmits feed light may be provided separately. Further, the optical fiber cable 200B may be composed of a plurality of optical fiber cables.

Although power over fiber systems have been described, the present disclosure is applicable to optical power supply in general.

In an optical power supply system according to at least one embodiment of the present disclosure, a PSE device includes a semiconductor laser that oscillates with electric power, thereby outputting feed light, and includes a semiconductor region exhibiting the light-electricity conversion effect, wherein a semiconductor material of the semiconductor region is a laser medium having a laser wavelength of 500 nm or less.

In at least one embodiment, the semiconductor material is the laser medium having a band gap of 2.4 eV or greater.

In at least one embodiment, the semiconductor material is one selected from diamond, gallium oxide, aluminum nitride and gallium nitride.

In an optical power supply system according to at least one embodiment of the present disclosure, a powered device includes a photoelectric conversion element that converts feed light into electric power, and includes a semiconductor region exhibiting the light-electricity conversion effect, wherein a semiconductor material of the semiconductor region is a laser medium having a laser wavelength of 500 nm or less.

In at least one embodiment, the semiconductor material is the laser medium having a band gap of 2.4 eV or greater.

In at least one embodiment, the semiconductor material is one selected from diamond, gallium oxide, aluminum nitride and gallium nitride.

According to an optical power supply system according to at least one embodiment of the present disclosure, a semiconductor material(s) having a high photoelectric conversion efficiency improves the photoelectric conversion efficiency at the power supplying side (PSE side) and/or the power receiving side (PD side) in optical power supply, and improves the optical power supply efficiency.

What is claimed is:

1. An optical power supply system comprising:
   a first data communication device including
      a power sourcing equipment (PSE) device, the PSE device including
         a first semiconductor laser configured to oscillate with electric power, and output feed light; and
      a first transmitter including
         a second semiconductor laser configured to output first laser light, and
         a first modulator configured to modulate the first laser light and output first signal light; and
   a second data communication device including
      a powered device comprising a photoelectric conversion element configured to convert the feed light into the electric power, the photoelectric conversion element including a semiconductor region exhibiting a light-electricity conversion effect, wherein a semiconductor material of the semiconductor region is a laser medium having a laser wavelength of 500 nm or less,
      a receiver configured to demodulate the first signal light to an electric signal, and output the electric signal,
      a data processing unit configured to receive the electric signal, transmit data of the electric signal to a node, and output the data as transmission data, and
      a second transmitter including
         a third semiconductor laser configured to output second laser light, and
         a second modulator configured to modulate the second laser light to a second signal light based on the transmission data, and output the second signal light to the first data communication device,
   wherein the first data communication device and the second data communication device perform optical communication with each other, and
   the electric power obtained by the conversion of the feed light by the photoelectric conversion element is driving power for the second transmitter and the receiver.

2. The optical power supply system according to claim 1, wherein the semiconductor material is the laser medium having a band gap of 2.4 eV or greater.

3. The optical power supply system according to claim 1, wherein the semiconductor material is diamond.

4. The optical power supply system according to claim 1, wherein the semiconductor material is gallium oxide.

5. The optical power supply system according to claim 1, wherein the semiconductor material is aluminum nitride.

6. The optical power supply system according to claim 1, wherein the semiconductor material is gallium nitride.

7. The optical power supply system according to claim 1, further comprising an optical fiber cable that includes a first end connectable to the PSE device and a second end connectable to the powered device to transmit the feed light.

8. The optical power supply system according to claim 1, further comprising an optical fiber cable that includes a first end connectable to the first data communication device and a second end connectable to the second data communication device to transmit the feed light, the first signal light, and the second signal light.

9. The optical power supply system according to claim 1, further comprising
- a first optical fiber cable connecting the first data communication device and the second data communication device to transmit the feed light, and
- a second optical fiber cable connecting the first data communication device and the second data communication device to transmit the first and second signal lights.

10. The optical power supply system according to claim 1, wherein the first data communication device further comprises another receiver configured to receive and demodulate the second signal light to another electric signal.

* * * * *